United States Patent
Ritter et al.

(10) Patent No.: US 9,220,185 B2
(45) Date of Patent: Dec. 22, 2015

(54) SET-TOP BOX HAVING DISSIPATING THERMAL LOADS

(75) Inventors: Darin Bradley Ritter, Indianapolis, IN (US); Mickey Jay Hunt, Camby, IN (US); Mark William Gysin, Noblesville, IN (US); Rodger Anthony Diemer, Indianapolis, IN (US)

(73) Assignee: THOMSON LICENSING, Issy-les Moulineaux (FR)

( * ) Notice: Subject to any disclaimer, the term of this patent is extended or adjusted under 35 U.S.C. 154(b) by 0 days.

(21) Appl. No.: 13/698,868

(22) PCT Filed: May 12, 2011

(86) PCT No.: PCT/US2011/036171
§ 371 (c)(1),
(2), (4) Date: Nov. 19, 2012

(87) PCT Pub. No.: WO2011/146302
PCT Pub. Date: Nov. 24, 2011

(65) Prior Publication Data
US 2013/0063895 A1    Mar. 14, 2013

Related U.S. Application Data

(60) Provisional application No. 61/346,073, filed on May 19, 2010, provisional application No. 61/400,767, filed on Aug. 2, 2010.

(51) Int. Cl.
*H05K 7/20* (2006.01)
*H01L 23/36* (2006.01)
(Continued)

(52) U.S. Cl.
CPC ............ *H05K 7/20409* (2013.01); *H01L 23/36* (2013.01); *H01L 23/3677* (2013.01); *H05K 7/20445* (2013.01); *H01L 2924/0002* (2013.01)

(58) Field of Classification Search
CPC . H05K 7/20; H05K 7/20436; H05K 7/20409; H05K 7/20445; G06F 1/20; G06F 1/16
USPC ......... 361/679.01, 679.46–679.55, 688, 689, 361/690–697, 704–715, 719–724; 165/80.2, 80.3, 80.4, 104.33, 121–126, 165/185; 454/184; 364/708.1; 455/4.1, 4.2, 455/5.1, 6.2, 6.3; 235/380, 382, 382.5; 174/50.52, 50.54, 520, 15.1; 257/706–727; 312/223.2, 236, 265
See application file for complete search history.

(56) References Cited

U.S. PATENT DOCUMENTS 4,887,147 A    12/1989   Friedman
5,091,618 A     2/1992   Takahashi
(Continued)

FOREIGN PATENT DOCUMENTS

CN         1814339         8/2006
CN       201352820 Y     11/2009
(Continued)

OTHER PUBLICATIONS

Search Report Dated: Sep. 2, 2011.

*Primary Examiner* — Michail V Datskovskiy
(74) *Attorney, Agent, or Firm* — Robert D. Shedd; Richard LaPeruta

(57) ABSTRACT

A set-top box is provided that comprises a housing having a first vertical outer wall with a first vent and a second vertical outer wall with a second vent; a circuit board having a first heat source element and a second heat source element; a contoured heatsink in thermal engagement with the first heat source element, wherein the contoured heatsink overlies at least one-third of the circuit board and extends along the first vertical side wall; and a second heatsink contacting the second heat source element, wherein the second heatsink is located in only one half of the device and is aligned with the second vent. The multiple heatsinks and associated vents work in concert to improve heat dissipation.

14 Claims, 3 Drawing Sheets

(51) Int. Cl.
*H01L 23/367* (2006.01)
*G06F 1/20* (2006.01)

(56) References Cited

U.S. PATENT DOCUMENTS

| | | | |
|---|---|---|---|
| 5,402,309 A | 3/1995 | Ohgami et al. | |
| 5,620,242 A | 4/1997 | Leon et al. | |
| 5,667,397 A | 9/1997 | Broschard et al. | |
| 5,917,236 A | 6/1999 | Leader, III et al. | |
| 6,021,044 A | 2/2000 | Neville, Jr. et al. | |
| 6,025,991 A | 2/2000 | Saito | |
| 6,049,469 A | 4/2000 | Hood, III et al. | |
| 6,212,074 B1 | 4/2001 | Gonsalves et al. | |
| 6,223,815 B1 | 5/2001 | Shibasaki | |
| 6,382,995 B1 | 5/2002 | Bricaud et al. | |
| 6,411,507 B1 | 6/2002 | Akram | |
| 6,454,607 B2 | 9/2002 | Bricaud | |
| 6,524,361 B1 | 2/2003 | Thornton et al. | |
| 6,567,360 B1 | 5/2003 | Kagawa | |
| 6,593,673 B1 | 7/2003 | Sugai et al. | |
| 6,655,590 B1 | 12/2003 | McFeely et al. | |
| 6,672,514 B1 | 1/2004 | Brennan et al. | |
| 6,735,085 B2 | 5/2004 | McHugh et al. | |
| 7,158,380 B2 | 1/2007 | Green et al. | |
| 7,187,553 B2 | 3/2007 | Schmidberger | |
| 7,203,065 B1 * | 4/2007 | Sin Yan Too | 361/704 |
| 7,215,551 B2 * | 5/2007 | Wang et al. | 361/707 |
| 7,350,705 B1 | 4/2008 | Frederick et al. | |
| 7,450,387 B2 | 11/2008 | Cheng et al. | |
| 7,518,875 B2 | 4/2009 | Desrosiers et al. | |
| 7,791,874 B2 | 9/2010 | Reents et al. | |
| D631,449 S | 1/2011 | Ritter et al. | |
| 8,009,426 B2 | 8/2011 | Ahmad-Taylor et al. | |
| 8,620,162 B2 | 12/2013 | Mittleman | |
| 8,701,279 B2 | 4/2014 | Filson et al. | |
| 8,766,093 B2 | 7/2014 | Lee | |
| 8,773,858 B2 | 7/2014 | Burns | |
| 2001/0026441 A1 | 10/2001 | Nakamura | |
| 2002/0039286 A1 | 4/2002 | Frank, Jr. et al. | |
| 2002/0051338 A1 | 5/2002 | Jiang et al. | |
| 2002/0154487 A1 | 10/2002 | Weischhoff Van Rijn | |
| 2003/0178627 A1 | 9/2003 | Marchl et al. | |
| 2005/0111195 A1 | 5/2005 | Wu | |
| 2005/0128710 A1 * | 6/2005 | Beitelmal et al. | 361/709 |
| 2005/0248923 A1 | 11/2005 | Hsu | |
| 2006/0067054 A1 | 3/2006 | Wang et al. | |
| 2006/0148295 A1 | 7/2006 | Reents et al. | |
| 2006/0187643 A1 | 8/2006 | Tsurufusa | |
| 2006/0187645 A1 | 8/2006 | Numata | |
| 2006/0215357 A1 | 9/2006 | Green et al. | |
| 2007/0053513 A1 | 3/2007 | Hoffberg | |
| 2007/0058336 A1 | 3/2007 | Cheng | |
| 2007/0177356 A1 | 8/2007 | Panek | |
| 2008/0280482 A1 | 11/2008 | Huang | |
| 2009/0148638 A1 | 6/2009 | Kishi et al. | |
| 2010/0073881 A1 | 3/2010 | Williams | |
| 2010/0097768 A1 | 4/2010 | Ishii et al. | |
| 2012/0140417 A1 | 6/2012 | Aspas Puertolas et al. | |
| 2012/0243176 A1 | 9/2012 | Ritter et al. | |
| 2013/0347051 A1 | 12/2013 | Bose et al. | |

FOREIGN PATENT DOCUMENTS

| | | |
|---|---|---|
| CN | 201515429 U | 6/2010 |
| CN | 201571126 U | 9/2010 |
| CN | 102714928 A | 10/2012 |
| DE | 202005013758 | 1/2006 |
| EP | 0399763 | 3/1997 |
| EP | 1248507 | 10/2002 |
| EP | 1610600 A2 | 12/2005 |
| FR | 2875917 | 9/2004 |
| FR | 2871022 A1 | 12/2005 |
| GB | 2355017 | 4/2001 |
| GB | 2436170 A | 9/2007 |
| JP | 06227553 | 8/1994 |
| JP | 786471 | 3/1995 |
| JP | 07059124 | 3/1995 |
| JP | 10004281 | 1/1998 |
| JP | 10154390 | 6/1998 |
| JP | 11-233982 A | 8/1999 |
| JP | 2000-269675 A | 9/2000 |
| JP | 2000269671 | 9/2000 |
| JP | 2001147061 | 5/2001 |
| JP | 2001-284748 A | 10/2001 |
| JP | 2001358482 | 12/2001 |
| JP | 2002134970 | 5/2002 |
| JP | 2002324989 | 11/2002 |
| JP | 2003017143 | 1/2003 |
| JP | 2004-186294 A | 7/2004 |
| JP | 2004-363525 A | 12/2004 |
| JP | 2007-208123 A | 8/2007 |
| JP | 2008-034474 A | 2/2008 |
| JP | 2009141160 | 6/2009 |
| WO | WO2007089321 | 8/2007 |
| WO | WO2007109216 | 9/2007 |
| WO | WO2009057124 | 5/2009 |
| WO | WO2010118971 | 10/2010 |
| WO | WO2011071516 | 6/2011 |
| WO | WO2011106082 | 9/2011 |
| WO | WO2011146302 | 11/2011 |
| WO | WO2011146302 A1 | 11/2011 |

* cited by examiner

SET-TOP BOX HAVING DISSIPATING THERMAL LOADS

CROSS-REFERENCE TO RELATED APPLICATIONS

This application claims the benefit, under 35 U.S.C. §365 of International Application PCT/US2011/036171, filed May 12, 2011, which was published in accordance with PCT Article 21(2) on Nov. 24, 2011 in English and which claims the benefit of U.S. Provisional Patent Application No. 61/346, 073, filed May 19, 2010 and U.S. Provisional Patent Application No. 61/400,767 filed Aug. 2, 2010.

FIELD OF THE INVENTION

The present invention relates to quiet set-top boxes having improved heat dissipating capabilities.

BACKGROUND OF THE INVENTION

Set-top boxes continue to be in high demand and an ever increasing need exists to reduce the size and improve aesthetic appeal, performance, functionality, and robustness of these devices and the like. As such, many set-top boxes now require smartcard readers, hard drives, and other heat generating elements.

Particular problems that such set-top boxes face are damage due to heat generation. However, a need exists for a means for dissipating heat without creating other complications such as noticeable noise or large spacial or footprint requirements. As such, heat dissipation fans, which tend to improve electrical robustness of the set-top boxes, are not preferable, because they do introduce noise and increase the size of set-top boxes. Also, other set-top box designs having vents on the top of the set-top boxes surprisingly require more internal free space (i.e., a larger outer casing) when there are no fans employed to appropriately dissipate heat. Additionally, these top vent systems place the set-top box in jeopardy of damage due to liquid spills.

In light of the requirement for set-top boxes to appropriately dissipate heat and yet also house more electronic components and meet customer preferences, a need exists for a new set-top box design that has improved heat dissipating capabilities.

SUMMARY OF THE INVENTION

An electronic device is provided that comprises a housing having a first vertical outer wall with a first vent and a second vertical outer wall with a second vent; a circuit board having a first heat source element and a second heat source element; a contoured heatsink in thermal engagement with the first heat source element, wherein the contoured heatsink overlies at least one-third of the circuit board and extends along the first vertical side wall; and a second heatsink contacting the second heat source element, wherein the second heatsink is located in only one half of the device and is aligned with the second vent. The contoured heatsink can have a planar peripheral portion and a central depression portion in which the planar peripheral portion completely or partially surrounds the central depression portion and the central depression portion contacts the first heat source element. The contoured heatsink can substantially overlie the circuit board and completely overlie the second heatsink. The second heatsink can be a finned heatsink or the second heatsink can be a contoured heatsink having a second planar peripheral portion and a second central depression in which the second planar peripheral portion surrounds at least a portion of the second central depression portion, and the second central depression portion contacts the second heat source element. If the second heatsink is a contoured heatsink, then the contoured heatsink can overlie less than half the circuit board and the second heatsink can overlie more than one-third of the circuit board. The device can comprise a frame that has a base and embosses, wherein the base is under the circuit board and the embosses contact and support the circuit board. The frame can have at least a first vertical side wall oriented along the first vertical outer wall and a second vertical side wall oriented along the second vertical outer wall in which the first vertical side wall has a first interior vent aligned with the first vent and the second vertical side wall has a second interior vent aligned with the second vent. The second heat source element can be a smart card reader and can be below the circuit board, wherein the circuit board can have heat passage via holes therethrough over the second heat source element and under the second heatsink where it contacts the circuit board or a thermal pad thereon.

BRIEF DESCRIPTION OF THE DRAWINGS

The invention will now be described by way of example with reference to the accompanying figures of which.

DETAILED DESCRIPTION OF THE EMBODIMENTS

Figure 1:
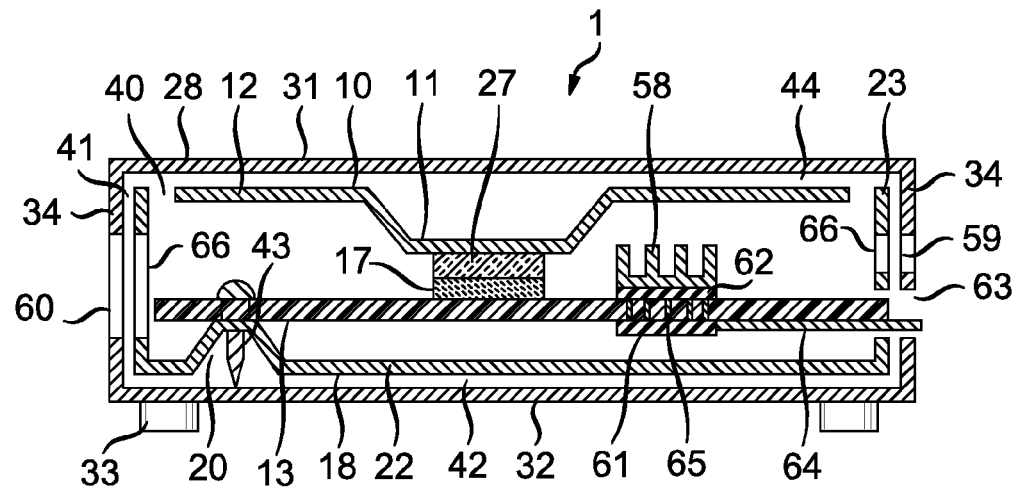
FIG. 1 shows a cross sectional interior view of the assembled set-top box according to a first embodiment of the invention with a front portion of the set-top box removed.

The invention is directed to arrangements for cooling an electronic assembly that generates a thermal load, for example a smart card reader, when the electronic assembly is disposed in a hostile thermal environment. A hostile thermal environment is one in which there is insufficient ventilation for adequate cooling, for example, a densely populated electronic box such as a set-top box, wherein desired design criteria are directed to compact, sleek designs with small footprints. Providing for sufficient cooling to dissipate thermal loads in such a set-top box is challenging under any circumstances.

In the exemplary embodiments of the invention disclosed herein, the cooling problem is exacerbated by including in a set-top box a low profile smart card reader that generates its own thermal load and that is mounted on the bottom side of a multilayer printed circuit board (PCB) disposed inside the set-top box. Dissipating the thermal load of the smart card reader is even more difficult due to a mounting location at the bottom of the set-top box, beneath a multilayer PCB on which are mounted other electronic components generating other thermal loads, and far removed from the top of the set-top box. With respect to conventional wisdom, placing the smart card reader in such a location is quite counter-intuitive. However, placing the smart card reader in such a location does enable the implementation of a desirable sleek design without objectionable top vents or objectionable fans. It will be understood by those skilled in the art that, in many if not most cases, vents in a set-top box may not be altogether avoided.

An electronic assembly such as a smart card reader can be safely positioned in a hostile thermal environment as described above, in accordance with the inventive arrangements taught herein. The smart card reader contacts are located on the bottom of the smart card reader and push the smart card upward against the bottom printed circuit board surface. Since the card surface is in direct contact with the printed circuit board, a patch or area of many copper-plated thru-hole vias is advantageously added in the board at the location of the smart card contacts. Other highly thermally conductive metal can be used to plate the vias. A thermally conductive pad is advantageously placed on the patch of vias and a heat sink is advantageously placed on the pad. A top broad heat sink has proved to be an effective way to cool the main integrated circuit of the set-top box, but the smart card reader adds an additional thermal load that may not be dissipated by the conventional top broad heat sink.

There are two exemplary embodiments taught herein and shown in the drawings for advantageously dissipating the thermal load generated by the smart card reader. In a first embodiment, a finned convecting heat sink 58 advantageously radiates heat through convection to vents on the outer sides 34 of the outer cover 28 of a set-top box 1. The first embodiment can be appreciated by particular reference to FIGS. 1-4.

FIG. 1 shows an internal view of the set-top box 1 in an assembled form with a front portion of the set-top box removed according to the first embodiment. FIG. 1 shows a top broad heat sink 10, which is an internal component. The top broad heat sink 10 can be a generally contoured plate that has a generally planar periphery 12 and a contoured central feature such as a pocket, central depression, notch, recess, multilevel depression, or mesa extending from and/or into a plane of the planar periphery. The central feature or central depression 11 can have side walls extending from the planar periphery and form an obtuse angle therewith. The contoured feature can have a flat bottom designed to contact the main integrated circuit and/or other heat generating component 17 on a main printed circuit board 13 which can be below it.

FIG. 1 further shows a main printed circuit board 13 or the like, which can be generally flat. The main printed circuit board 13 can have a main integrated circuit 17 or the like in a central region and holes for mounting and/or securing the main printed circuit board 13 to a frame pan 18. The main integrated circuit and other heat generating or hot components 17 can contact the flat bottom or other portion of the central depression 11 of the top broad heat sink 10, which can be in thermal contact with the other heat generating or hot components through a thermal joint 27 which could be a pad. The main printed circuit board 13 is shown being mounted and/or secured to embosses 20 of the frame pan 18 by use of screws, bolts or solder pad joints 43 through the holes or contact points in the circuit board 13, wherein the main printed circuit board 13 is effectively contacting the frame pan 18. This contact can be thermal contact.

Figure 2:
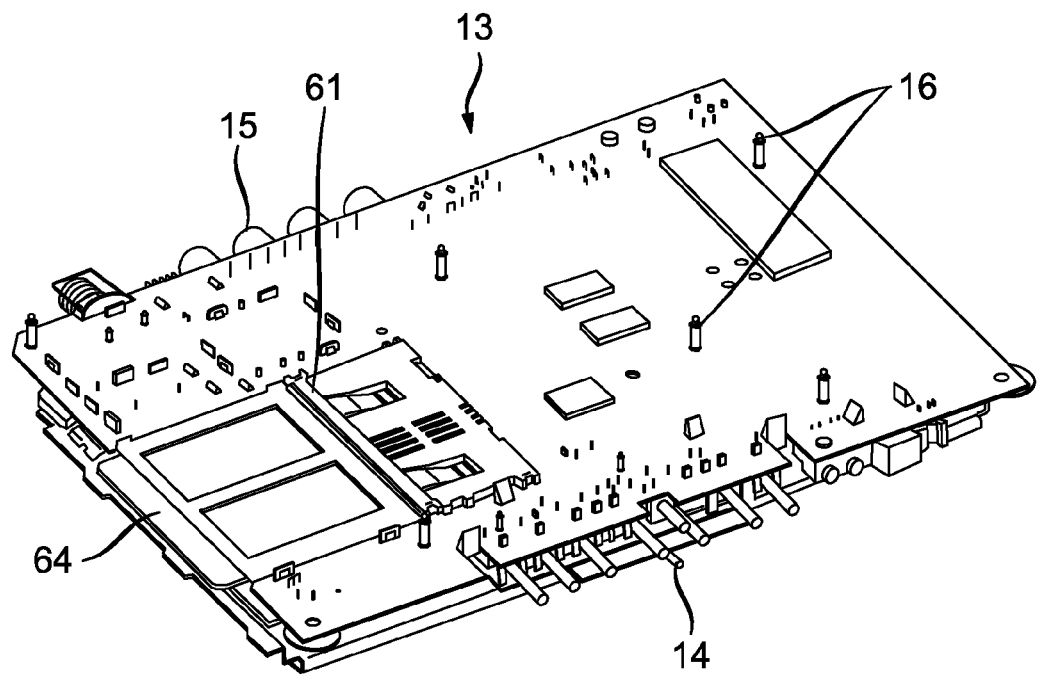
FIG. 2 shows a perspective view of the underside of the main printed circuit board according to the invention.

FIG. 2 shows a perspective view of the underside of the main printed circuit board 13 or the like. The main printed circuit board 13 can have in a central region of holes and associated pins 16 for primary or additional mounting and/or securing the main printed circuit board 13 to a frame pan 18. Other features of the main printed circuit board are shown in the figure which can include jack panel connectors 15 at one edge and a button cluster 14 at another edge. These edges can be opposing edges. FIG. 2 shows how the smart card reader 61 can be positioned on the main printed circuit board 13.

Figure 3:
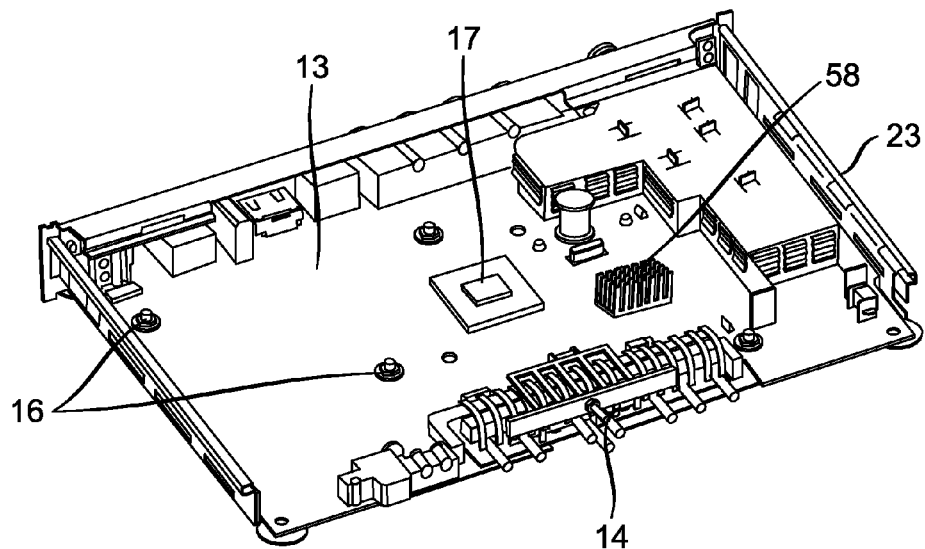
FIG. 3 shows a perspective view of the upper side of the main printed circuit board according to the invention.

FIG. 3 shows another perspective view of the upper side of the main printed circuit board 13 or the like in contact with the frame 18. FIG. 3 shows the main printed circuit board 13 can have main integrated circuit or other heat generating component 17 in a central region and holes and associated pins 16 for mounting and/or securing the main printed circuit board 13 to a frame pan 18. Additionally shown is the finned convecting heat sink 58.

In a particular example shown in FIG. 3, the finned convecting heat sink 58 is constructed of 24 fins in which there are four rows of flat evenly spaced fins with the planar portion oriented along the x-axis (or the long axis which is parallel to the front of the set-top box) and in which there are six columns of evenly spaced fins oriented along the y-axis (or short axis which is parallel to the sides of the set-top box). The finned convecting heat sink 58 having a long dimension in the x-axis being 17.78 mm, a short dimension in the y-axis being 10.18 mm, and a height being 10.11 mm. Keeping these dimensions within 20% of the stated dimensions can be effective. The gaps between the fins are U-shaped or V-shaped in which the depths of the gaps are greater than half the height of the finned convecting heat sink 58.

Figure 4:
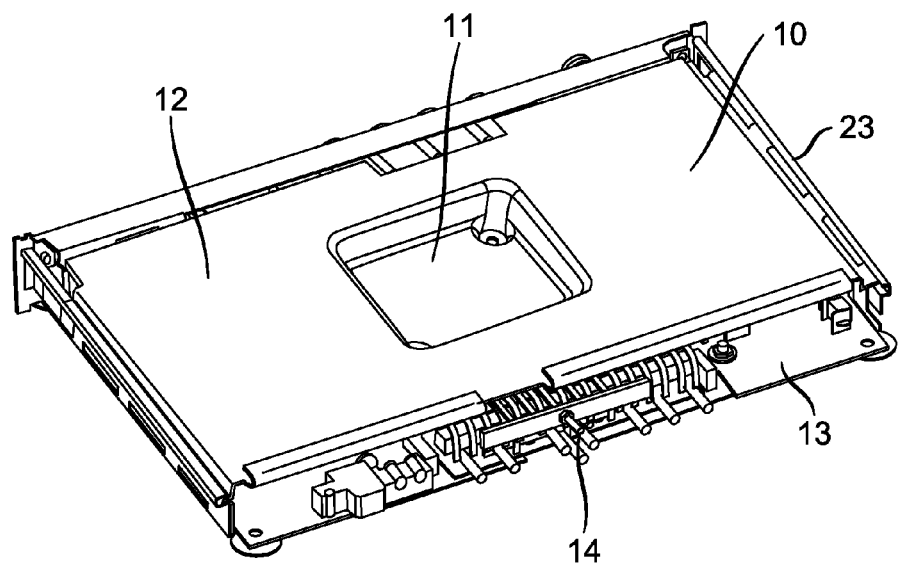
FIG. 4 shows a perspective view of the top broad heat sink on the main printed circuit board according to a first embodiment of the invention.

FIG. 4 shows a perspective view of the top broad heat sink 10 on the main printed circuit board 13. Here, one can see that the top broad heat sink 10 substantially covers the main printed circuit board 13.

Regarding the smart card reader 61, FIG. 1 further shows how the smart card reader 61 can be in contact with the main printed circuit board 13 and immediately thereunder. The smart card reader 61 is shown having a smart card 64 inserted therein through a smart card entrance port 63 in one of the outer sides 34. The smart card reader 61 is shown being in contact with at least one thermal pad joint 62 that conducts heat generated by the smart card reader 61 to the finned convecting heat sink 58 which is also in contact with the main printed circuit board 13 and positioned immediately thereon. Here, heat via holes 65 are shown being in the a main printed circuit board 13 to permit the heat from the smart card reader 61 to propagate to the finned convecting heat sink 58. The heat via holes 65 can be copper plated and the population of the heat via holes can be located substantially along and over the perimeter of the smart card reader 61 and uniformly distributed over the smart card reader 61 to optimize heat transfer from the smart card reader 61. It is advantageous to have the total plan view area of the via holes exceeding one-half area the plan view area of the via hole region, which is the region where the finned convecting heat sink 58 or the second heat sink contacts circuit board or the thermal pad joint. The vias can have vertical walls and can have an aspect ratio, which is a width or diameter of the via hole to height ratio, of 0.5 to 10.

Additionally, the set-top box 1 in FIG. 1 can have an outer cover 28 that further includes an upper wall 31, lower wall 32, and multiple outer sides 34. The exterior side of the lower wall 32 can include rubber feet 33 which can be at least 6 mm in height to ensure adequate air entry under the set-top box for improved thermal management.

FIG. 1 also shows at least one proximal vent 59 in one of the outer sides 34 which is positioned in the general proximity of the finned convecting heat sink 58. It is preferable that the proximal vent 59 be positioned in one of the vertical outer sides 34 at a place that is closest to the finned convecting heat sink 58. At least one general vent 60 is shown which can be at other locations on other outer sides 34. The general vents 60 can further assist with the dissipation of heat. Additionally, the frame pan 18 can have side walls 23 that have complementary vents 66 which can be aligned with the vents of the outer sides 34. Having the vents on the outer sides in the combination of top broad heat sink 10 and the finned convecting heat sink 58 eliminates or can eliminate the need for vents in the upper wall 31.

FIG. 1 further shows outer gaps 41 between the side walls 23 of the frame pan 18 and the outer side 34 of the outer cover 28; inner gaps 40 between the edge of the planar periphery 12 of the top broad heat sink 12 and the side walls 23 of the frame pan 18; bottom gap 42 between the lower wall 32 of the outer cover 28 and the base 22 of the frame pan 18; and upper gap 44 between the upper wall 31 of the outer cover 28 and the planar periphery 12 of the top broad heat sink 10. The bottom gap 42 and upper gap 44 prevent the outer cover 28 from overheating.

Since the card surface is in direct contact with the printed circuit board, a patch or area of many copper-plated through hole vias is advantageously added in the board at the location of the smart card contacts. A thermally conductive pad is advantageously placed on the patch of vias 62 and a heat sink is advantageously placed on the pad. A top broad heat sink has proved to be an effective way to cool the main integrated circuit of the set top box, but the smart card reader adds an additional thermal load that cannot be dissipated by the conventional top broad heat sink. However, the finned heat sink and proximal vents have enhanced the thermal management of the set-top box.

In a second embodiment, the top broad radiating heat sink, previously embodied as a unitary heat sink, is advantageously split or divided into two parts or two separate heat sinks. One of the two parts is in thermal contact with the main integrated circuit in the set-top box. The other of the two parts is in thermal contact with the smart card through the patch or area of vias. The second embodiment can be appreciated by reference to FIG. 5.

Figure 5:
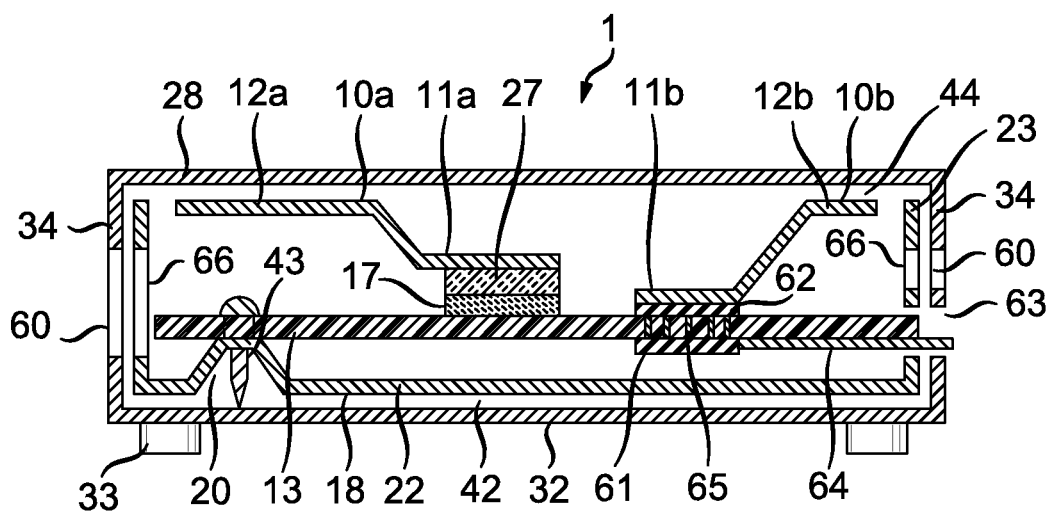
FIG. 5 shows a cross sectional interior view of the assembled set-top box according to a second embodiment of the invention with a front portion of the set-top box removed.

FIG. 5 shows an internal view of the set-top box 1 in an assembled form with a front portion of the set-top box removed according to the second embodiment. FIG. 5 shows first top broad heat sink 10a, which is an internal component. The top broad heat sink 10a can be a generally contoured plate that has a generally planar periphery 12a and a contoured central feature such as a pocket, central depression, notch, recess, multilevel depression, or mesa extending from and/or into a plane of the planar periphery, wherein the planar periphery 12a preferably only surrounds part of the or central depression 11a. Here, the planar periphery 12a surrounds 3 sides of the central depression 11a. The central feature or central depression 11a can have side walls extending from the planar periphery and form an obtuse angle therewith. The contoured feature can have a flat bottom designed to contact the main integrated circuit and/or other heat generating component 17 on a main printed circuit board 13 which can be below it.

FIG. 5 also shows the second top broad heat sink 10b, which is an internal component. The top broad heat sink 10b can also be a generally contoured plate that has a generally planar periphery 12b and a contoured central feature such as a pocket, central depression, notch, recess, multilevel depression, mesa extending from and/or into a plane of the planar periphery, wherein the planar periphery 12b preferably only surrounds part of the central depression 11b. In the one embodiment, the planar periphery 12b surrounds 3 sides of the central depression 11b. The central feature or central depression 11b can have side walls extending from the planar periphery and form an obtuse angle therewith. The contoured feature can have a flat bottom designed to contact the main printed circuit board 13 in the region where the smart card reader 61 is located. The smart card reader 61 is shown being in contact with at least one thermal pad joint 62 that conducts heat generated by the smart card reader 61 to the second top broad heat sink 10b which is also in contact with the main printed circuit board 13 and thereon. Here, heat transmissive via holes 65 are positioned in the main printed circuit board 13 to permit the heat from the smart card reader 61 to propagate to the second top broad heat sink 10b. The heat via holes 65 can be copper plated and the population of the heat via holes can be located substantially along the perimeter of the smart card reader 61 and uniformly distributed over the smart card reader 61 to optimize heat transfer from the smart card reader 61. The vias can have the same characteristics and dimensional aspects in this embodiment as in the first embodiment.

In the second embodiment, the main printed circuit board 13, frame pan 18 and the outer cover 28 are generally the same as in the first embodiment of the invention. The frame pan 18 also can have complementary vents 66 which can be aligned with the vents 60 of the outer sides 34, wherein the edges of planar peripheries 12a, 12b run along the outer sides 34.

It should be understood that although examples of the claimed inventions specifically mention set-top boxes and circuit boards, the invention is not limited to these features. For example, the invention is applicable to computers and other electronic devices having heat generating components. Furthermore, the invention is also applicable to electronic parts other than circuit boards which can generate heat.

The invention is not limited to the precise arrangements and instrumentalities shown. As such, the invention is intended to apply, for example, to heat source elements such as hard drives, smart card readers, integrated circuits, and light sources that could be used to light buttons. Further, when a heatsink is said to be contacting a heat source element, this can imply through direct contact or contact through an intermediary component such as via holes and/or thermal pads or thermal joints. Additionally, the expression "vent" can imply a single vent opening or multiple localized vent openings; the expression "substantially overlying" is intended to mean completely overlying or overlying at 90% of a surface of a structure; the expression "planar peripheral portion" can mean that the portion is completely planar or can include portions which are generally planar, but may have some raised portions or groves which may be needed to add structural integrity or may be needed to accommodate components in the set-top box.

The invention claimed is:

1. A set-top box comprising:
    a housing having a first vertical outer wall with a first vent and a second vertical outer wall with a second vent;
    a circuit board having a first heat source element and a second heat source element;
    a contoured heatsink in thermal engagement with the first heat source element, wherein the contoured heatsink overlies at least one-third of the circuit board and extends along a first vertical side wall;
    a second heatsink contacting the second heat source element, wherein the second heatsink is located in only one half of the set-top and is aligned with the second vent; and,
    a frame pan within the housing, the frame pan having a base and embosses, wherein the base is under the circuit board and over a lower wall of the housing and the embosses contact and support the circuit board.

2. The set-top box of claim 1 wherein
    the contoured heatsink has a planar peripheral portion and a central depression portion, the planar peripheral portion surrounds at least a portion of the central depression portion, and the central depression portion contacts the first heat source element.

3. The set-top box of claim 1 wherein the frame pan has at least the first vertical side wall oriented along the first vertical outer wall and a second vertical side wall oriented along the second vertical outer wall, and the first vertical side wall has a first interior vent aligned with the first vent and the second vertical side wall has a second interior vent aligned with the second vent.

4. The set-top box of claim 2 wherein the contoured heatsink has a planar peripheral portion completely surrounding the central depression portion, and the contoured heatsink substantially overlies the circuit board and completely overlies the second heatsink.

5. The set-top box of claim 4 wherein the second heatsink is a finned heatsink.

6. The set-top box of claim 3 wherein the contoured heatsink substantially overlies the circuit board and completely overlies the second heatsink.

7. The set-top box of claim 6 wherein the second heatsink is a finned heatsink.

8. The set-top box of claim 3 wherein the contoured heatsink has a planar peripheral portion completely surrounding a central depression portion, the contoured heatsink substantially overlies the circuit board and completely overlies the second heatsink, and the central depression portion contacts the first heat source element.

9. The set-top box of claim 8 wherein the second heatsink is a finned heatsink.

10. The set-top box of claim 2 wherein the second heatsink has a second planar peripheral portion and a second central depression, the second planar peripheral portion surrounds at least a portion of the second central depression portion, and the second central depression portion contacts the second heat source element.

11. The set-top box of claim 10 wherein the contoured heatsink overlies less than half the circuit board and the second heatsink overlies more than one-third of the circuit board.

12. The set-top box of claim 11 comprising the frame pan therein having the base and embosses, wherein the base is under the circuit board and the embosses contact and supports the circuit board, the frame pan has at least the first vertical side wall oriented along the first vertical outer wall and a second vertical side wall oriented along the second vertical outer wall, and the first vertical side wall has a first interior vent aligned with the first vent and the second vertical side wall has a second interior vent aligned with the second vent.

13. The set-top box of claim 12, wherein the second heat source element is below the circuit board and the circuit board has heat passage via holes therethrough over the second heat source element and under the second central depression portion, whereby heat generated by the second heat source element transfers to the second heatsink through the heat passage via holes.

14. The set-top box of claim 9, wherein the second heat source element is below the circuit board and the circuit board has heat passage via holes therethrough over the second heat source element and under the second central depression portion, whereby heat generated by the second heat source element transfers to the second heatsink through the heat passage via holes.

* * * * *